(12) United States Patent
Chang et al.

(10) Patent No.: US 6,881,020 B2
(45) Date of Patent: Apr. 19, 2005

(54) POD TRANSFER SYSTEM HAVING RETRACTABLE MAST AND ROTATABLE AND VERTICALLY MOVABLE HOIST

(75) Inventors: Cheng-Chang Chang, Ping-Cheng (TW); Chien-Jung Huang, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 147 days.

(21) Appl. No.: 10/133,526

(22) Filed: Apr. 26, 2002

(65) Prior Publication Data

US 2003/0202867 A1 Oct. 30, 2003

(51) Int. Cl.⁷ .............................................. G06F 15/50
(52) U.S. Cl. .................................... 414/217.1; 414/940
(58) Field of Search ............................ 414/217.1, 940, 414/626, 226.05, 744.3, 806

(56) References Cited

U.S. PATENT DOCUMENTS 5,570,990 A * 11/1996 Bonora et al. .............. 414/543
5,842,917 A * 12/1998 Soung et al. ................ 454/187
5,950,643 A *  9/1999 Miyazaki et al. ........... 134/25.4
6,169,935 B1 *  1/2001 Iwasaki et al. .............. 700/214
6,332,744 B1 * 12/2001 Fukushima et al. ......... 414/283
6,468,021 B1 * 10/2002 Bonora et al. ............... 414/522
6,604,624 B1 *  8/2003 Hirata et al. ................ 198/494

FOREIGN PATENT DOCUMENTS

TW                  431933            7/1999

* cited by examiner

Primary Examiner—Thomas J. Brahan
(74) Attorney, Agent, or Firm—Tung & Associates

(57) ABSTRACT

A pod transfer system having a retractable mast and a rotatable and vertically movable hoist is disclosed. A first extendable robot is situated under a first overhead transfer (OHT) unit, and a second extendable robot is situated under the second OHT unit. Each extendable robot has a fully retracted position for loading a pod from its respective OHT unit, as well as a fully extended position. The retractable mast is situated between a first conveyer and a second conveyer that are themselves situated between the OHT units. The retractable mast has a default fully extended position and a tool move-in fully retracted position. The hoist is situated on the retractable mast. The hoist is able to load the pod from either robot when the robot is in its fully extended position, and is able to load the pod to one of the conveyors.

17 Claims, 3 Drawing Sheets

POD TRANSFER SYSTEM HAVING RETRACTABLE MAST AND ROTATABLE AND VERTICALLY MOVABLE HOIST

FIELD OF THE INVENTION

This invention relates generally to pods, such as front-opening unified pods (FOUP's) for transferring semiconductor wafers, and more particularly to transfer systems for such pods.

BACKGROUND OF THE INVENTION

The fabrication of semiconductor devices on semiconductor wafers requires that the semiconductor wafers be processed in a variety of different manners. Photolithography, chemical mechanical polishing (CMP), metal deposition, and so on, are all processes performed on semiconductor wafers in precise degrees to fabricate semiconductor devices. Usually, each of these different processes is performed using a different piece of semiconductor fabrication equipment. Therefore, a transport system is used to transport the semiconductor wafers among the different pieces of semiconductor fabrication equipment to achieve semiconductor device fabrication. Usually the semiconductor wafers are transported in pods, such as front-opening unified pods (FOUP's).

FIG. 1 shows a top view of a traditional pod transport system 100. The system 100 particularly includes a conveyer 104 on which the pods may be transported among various stations 102a, 102b, . . . , 102n. Each of these stations 102a, 102b, . . . , 102n may be a separate piece of semiconductor fabrication equipment, a storage place to store pods and their semiconductor wafers, and so on. Overhead transfer (OHT) units 106 are able to move the pods vertically.

One particular area 108 of the system 100 of FIG. 1 is shown in more detail in a side view in FIG. 2. One of the OHT units 106 has a pod 202a that it is vertically lowering onto one of the load ports 204. One of the robot arms 208 has lowered on its vertical axis 206 to pick up the pod 202b that has already been lowered onto one of the load ports 204. The other of the robot arms 208 has risen on its vertical axis 206 to deposit the pod 202c onto one of the conveyer belts 104. In this way, pods 202 are moved from the OHT units 106 to the load ports 204, and ultimately to the conveyer belts 104.

Unfortunately, the use of robot arms 208 that are vertically movable on the stationary vertical axes 206 is problematic. First, such usage compromises vertical clearance between the load ports 204 and the conveyors 104. This is disadvantageous, because vertical clearance of at least three meters is desirable so that new semiconductor fabrication equipment and tools can be easily moved in and moved out. Furthermore, the robot arms 208 and/or the stationary vertical axes 206 are typically located less than fifteen centimeters away from the OHT unit 106. This is also disadvantageous, because the OHT units 106 typically have proximity collision sensors that are triggered when anything is located less than fifteen centimeters away from them.

Therefore, there is a need to overcome these disadvantages. Specifically, there is a need for a pod transfer system that avoids comprising vertical clearance. There is also a need for such a transfer system that does not trigger the proximity collision sensors of the OHT units. For these and other reasons, there is a need for the present invention.

SUMMARY OF THE INVENTION

The invention relates to a pod transfer system having a retractable mast and a rotatable and vertically movable hoist. A first extendable robot is situated under a first overhead transfer (OHT) unit, and a second extendable robot is situated under the second OHT unit. Each extendable robot has a fully retracted position for loading a pod from its respective OHT unit, as well as a fully extended position. The retractable mast is situated between a first conveyer and a second conveyer that are themselves situated between the OHT units. The retractable mast has a default fully extended position and a tool move-in fully retracted position. The hoist is situated on the retractable mast. The hoist is able to load the pod from either robot when the robot is in its fully extended position, and is able to load the pod to one of the conveyers.

Embodiments of the invention provide for advantages over the prior art. Because the mast is fully retractable, there is significant vertical clearance, such as at least three meters, to allow for easy tool move-in and move-out. Unlike the two vertical axes of the prior art, there is only one mast, so that the proximity and collision sensors of the OHT units are not triggered by the mast or the hoist. That is, preferably the mast and the hoist are more than fifteen centimeters away from the OHT units. Furthermore, the use of a single mast and hoist, instead of two vertical axes and two robot arms, means that the invention is more cost efficient as compared to the prior art. Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
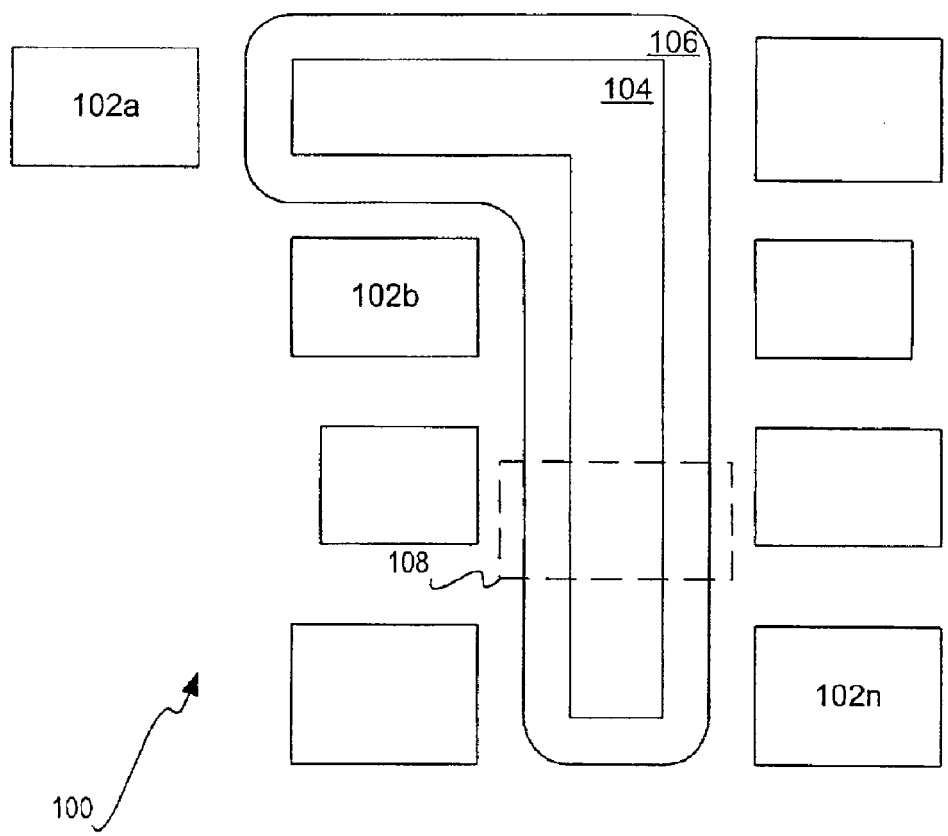
FIG. 1 is a diagram of a top view of a pod transfer system according to the prior art. The pod transfer system includes conveyors and overhead transfer (OHT) units for moving pods of semiconductor wafers to different semiconductor fabrication equipment.
Figure 2:
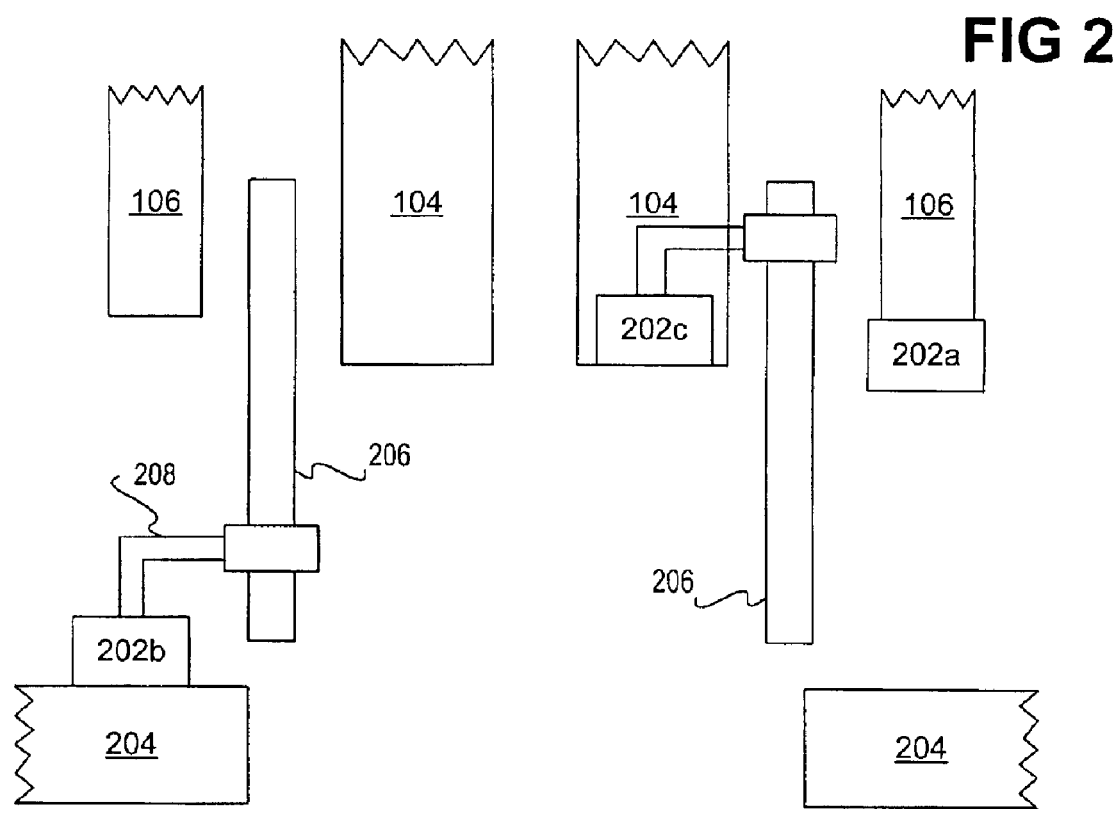
FIG. 2 is a diagram of a side view of the pod transfer system of FIG. 1, in which there are two robot arms vertically movable on respective stationary vertical axes for transporting pods from load ports to conveyors.
Figure 3:
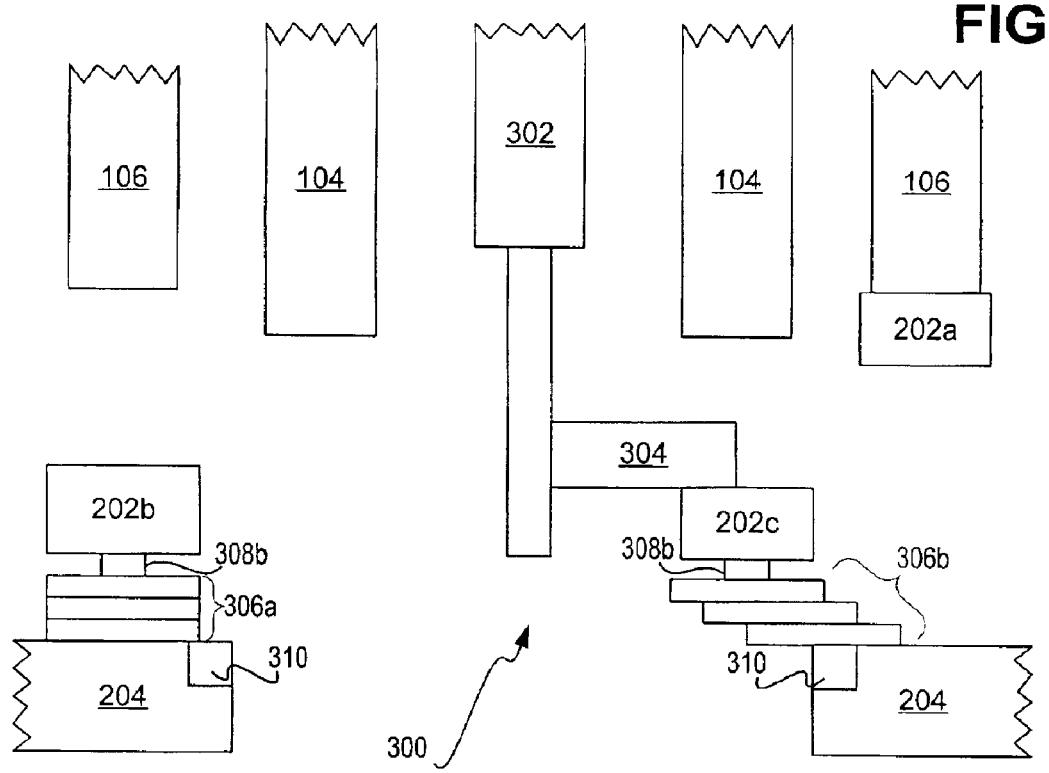
FIG. 3 is a diagram of a side view of a pod transfer system according to an embodiment of the invention, in which there is a retractable mast, and rotatable and vertically movable hoist, and extendable robots for transporting pods from load ports to conveyors. The diagram of FIG. 1 may be considered a top view of the pod transfer system of FIG. 3 in one embodiment of the invention.

FIG. 3 shows the side view of a pod transfer system 300 according to an embodiment of the invention. The pods transferred by the system 300 may be front-opening unified pods (FOUP's), or other types of pods. Overhead transport (OHT) units 106 allow for vertical loading and unloading of pods. For instance, one of the OHT units 106 has a pod 202a that is being vertically transported. The OHT units 106 allow for vertical loading and unloading specifically relative to the load ports 204. However, there are extendable robots 306a and 306b on the load ports 204. Each of the extendable robots 306a and 306b has a fully extended position and a fully retracted position. As shown in FIG. 3, the extendable robot 306a is in the fully retracted position, and the extendable robot 306b is in the fully extended position.

Preferably, the extendable robots 306a and 306b have clamps 308a and 308b, respectively. The clamps 308a and 308b specifically clamp onto pods. For instance, the pod 202b is clamped onto the pod 308a of the extendable robot 306a, whereas the pod 202c is clamped onto the pod 308b of the extendable robot 306b. The clamps 308a and 308b prevent the pods 202b and 202, respectively, from falling off or otherwise moving during undesirable circumstances, such as the occurrences of earthquakes, and so on. The extendable robots 306a and 306b allow for their respective pods to be moved from under the OHT units 106 to under the conveyors 104.

The mast 302 is situated between the conveyors 104. The mast 302 is fully retractable. However, its default position is a fully extended position. When vertical clearance is necessary between the load ports 204 and the conveyors 104, the mast 302 fully retracts to its fully retracted position, though. Situated on the mast 302 is a vertically movable and rotatable hoist 304. As shown in FIG. 3, the hoist 304 is loading the pod 202c from the extendable robot 306b. The hoist 304 is able to rotate to load a pod from either the extendable robot 306a or the extendable robot 306b, however. The hoist 304 is then able to move up vertically, to deposit its carried pod to either of the conveyors 104.

Furthermore, the load ports 204 have tag readers 310. The tag readers 310 are able to read tags on the pods so that they may be properly identified, and so that the locations of all the pods being transported through the system 300 may be known at all times. Thus, a pod is first lowered from one of the OHT units 106 to one of the extendable robots 306a and 306b on one of the load ports 204, where the extendable robot 306a or 306b is in the fully retracted position. One of the tag readers 310 reads a tag on the pod. The extendable robot 306a or 306b then extends to its fully extended position, and the hoist 304 lowers and rotates as necessary to load the pod from the extendable robot 306a or 306b. The hoist 304 rises and rotates as necessary to load the pod to one of the conveyors 104, and rotates and/or lowers as appropriate to be ready for the next pod it is to move.

As has been indicated, the pod transfer system 300 provides for advantages. The mast 302 and the hoist 304 can be situated in a narrow space, since only one mast and one hoist are needed. When the mast 302 is fully retracted, the tool move-in and move-out vertical clearance is maximized preferably as at least three meters. The proximity and collision sensors of the OHT units 106 are not triggered, because the conveyors 104, the closest components thereto, are more than fifteen centimeters away, preferably. It is noted that software can be used to preferably control the entire system 300, and this software may be located, for instance, within various components of the system 300.

Figure 4:
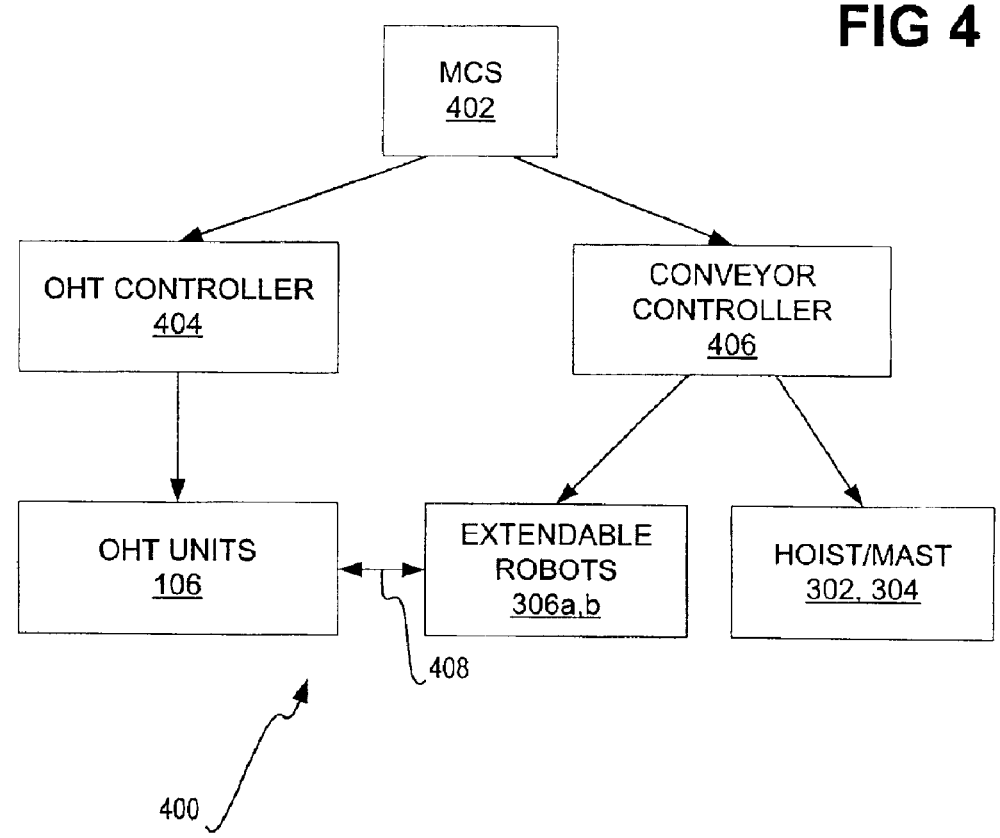
FIG. 4 is a diagram of software that can be used to control the pod transfer system of FIG. 3, according to an embodiment of the invention. The software of FIG. 4 specifically includes an OHT controller and a conveyor controller.

FIG. 4 shows a software system 400 for controlling the pod transfer system 300, according to an embodiment of the invention. The material control system (MCS) 402 includes an OHT controller 404, and a conveyor controller 406. The OHT controller 404 is software specifically for controlling the OHT units 106. The conveyer controller 406 can control the conveyors 104 (not shown in FIG. 4), as well as may control the extendable robots 306a and 306b, and the hoist 302 and the mast 304. The OHT units 106 and the extendable robots 306a and 306b further may communicate with one another via software indicated by the bi-directional arrow 408, which may be located on the OHT units 106 themselves.

Figure 5:
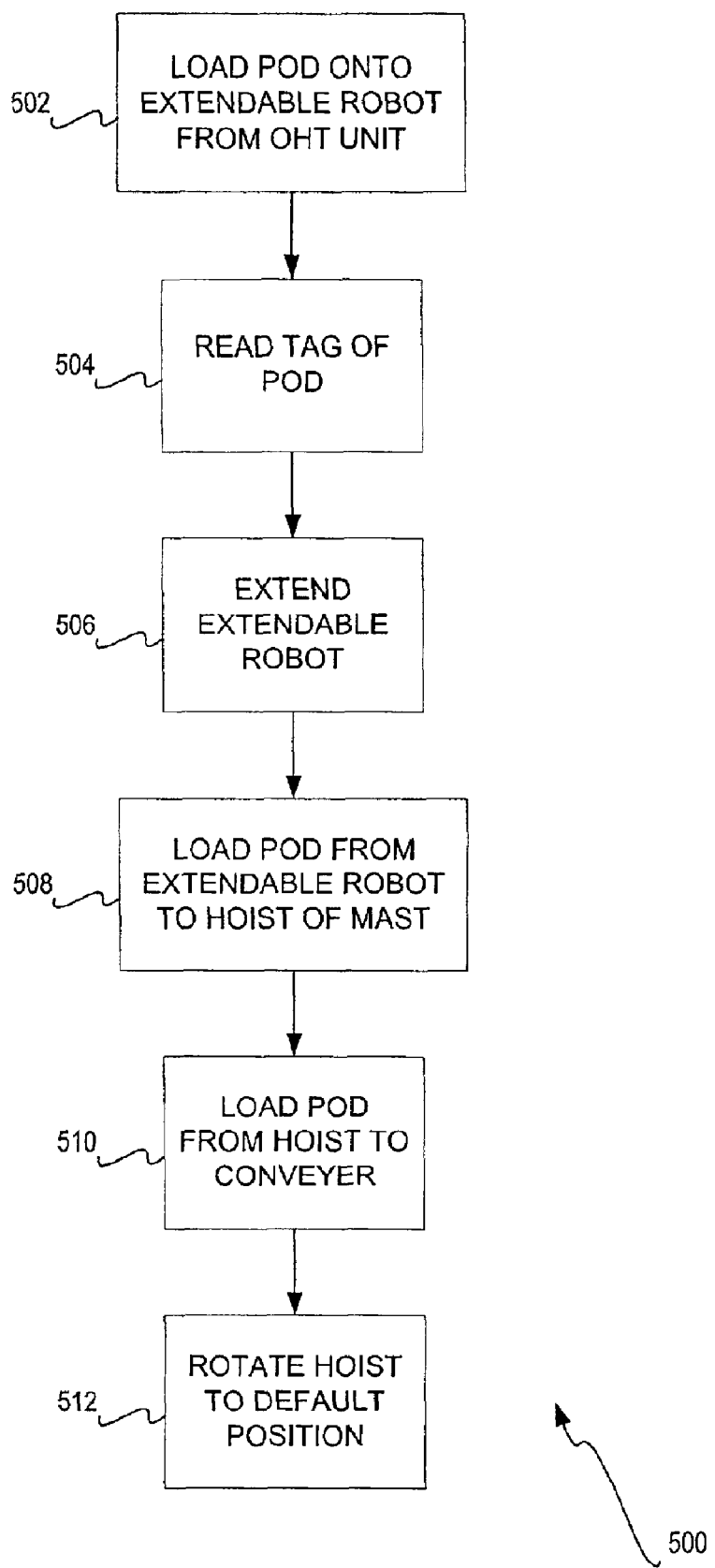
FIG. 5 is a flowchart of a method that the pod transfer system of FIG. 3 can perform. The method of FIG. 5 specifically outlines how a pod is loaded from an OHT unit to an extendable robot on a load port, and then from the extendable robot to a conveyor via the hoist situated on the mast.

FIG. 5 shows a method 500 that can be performed by the pod transfer system 300 of FIG. 3, by using the software 400 of FIG. 4, according to an embodiment of the invention. First, a pod is loaded onto an extendable robot in its fully retracted position from an OHT unit (502). Specifically, the pod may be clamped onto the clamp of the extendable robot. A tag of the pod is read by a tag reader (504), to identify and locate the pod. The extendable robot is then extended from its fully retractable position to its fully extended position underneath a conveyor (506). The pod is loaded from the extendable robot to the hoist situated on the mast (508). The hoist may need to initially rotate and move downward to load the pod, and the pod may need to be unclamped from the clamp of the extendable robot. The pod is then loaded from the hoist to the conveyor (510), and the hoist rotated to its default position (512).

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A system comprising:
   a first overhead transfer (OHT) unit and a second OHT unit;
   a first extendable robot situated under the first OHT unit and a second extendable robot situated under the second OHT unit;
   a first conveyer and a second conveyer situated between the first OHT unit and the second OHT unit;
   a retractable mast situated between the first conveyer and the second conveyer; and,
   a rotatable and vertically movable hoist situated on the retractable mast.

2. The system of claim 1, further comprising a pod having a top surface, such that the first OHT unit, the second OHT unit, and the retractable mast each is able to clasp the pod by the top surface.

3. The system of claim 2, wherein the pod comprises a front-opening unified pod (FOUP).

4. The system of claim 1, further comprising a first clamp situated on the first extendable robot and a second clamp situated on the second extendable robot.

5. The system of claim 4, further comprising a pod having a bottom surface, such that the first clamp and the second clamp each is able to clasp the pod by the bottom surface.

6. The system of claim 5, wherein the pod comprises a front-opening unified pod (FOUP).

7. The system of claim 1, further comprising a first load port situated underneath the first extendable robot and a second load port situated underneath the second extendable robot.

8. The system of claim 7, further comprising a first tag reader situated on the first load port and a second tag reader situated on the second load port.

9. The system of claim 1, wherein each of the first OHT unit and the second OHT unit has a proximity sensor sensitive to a predetermined distance, the first convey and the second convey located sufficiently away from the first OHT unit and the second OHT unit to not trigger the proximity sensor.

10. The system of claim 1, wherein the retractable mast has a default fully extended position and a tool move-in fully retracted position.

11. The system of claim 1, wherein each of the first extendable robot and the second extendable robot has a fully retracted position for loading a pod from one of the first and the second OHT units, and a fully extended position for loading the pad to the hoist.

12. The system of claim 1, further comprising software to control the system.

13. A system comprising:
a first extendable robot situated under a first overhead transfer (OHT) unit and a second extendable robot situated under the second OHT unit, each of the first extendable robot and the second extendable robot having a fully retracted position for loading a pod from one of the first and the second OHT units and having a fully extended position;
a retractable mast situated between a first conveyer and a second conveyer situated between the first OHT unit and the second OHT unit, the retractable mast having a default fully extended position and a tool move-in fully retracted position; and,
a rotatable and vertically movable hoist situated on the retractable mast, the hoist able to load the pod from one of the first and the second extendable robots when in the fully extended position, the hoist able to load the pod to one of the first and the second conveyors.

14. The system of claim 13, wherein the first extendable robot is further situated on a first load port and the second extendable robot is further situated on a second load port.

15. The system of claim 14, wherein each of the first load port and the second load port has a tag reader situated thereon for reading a tag of the pod.

16. The system of claim 13, wherein the pod comprises a front-opening unified pod (FOUP).

17. The system of claim 13, further comprising software to control the system.

* * * * *